United States Patent
Lafollett et al.

(10) Patent No.: US 12,176,191 B2
(45) Date of Patent: Dec. 24, 2024

(54) MAGNETRON DESIGN FOR IMPROVED BOTTOM COVERAGE AND UNIFORMITY

(71) Applicant: Applied Materials, Inc., Santa Clara, CA (US)

(72) Inventors: Cory Lafollett, Santa Clara, CA (US); Jie J. Zhang, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/214,498

(22) Filed: Jun. 26, 2023

(65) Prior Publication Data

US 2024/0290593 A1     Aug. 29, 2024

Related U.S. Application Data

(60) Provisional application No. 63/448,974, filed on Feb. 28, 2023.

(51) Int. Cl.
    *H01J 37/34*     (2006.01)
    *C23C 14/35*     (2006.01)

(52) U.S. Cl.
    CPC .......... *H01J 37/3452* (2013.01); *C23C 14/35* (2013.01); *H01J 37/3405* (2013.01); *H01J 37/3455* (2013.01); *H01J 2237/332* (2013.01)

(58) Field of Classification Search
    CPC ............... H01J 37/3452; H01J 37/3455; H01J 37/3461; H01J 37/3405; H01J 2237/332; C23C 14/35
    USPC ........................................ 204/298.2, 298.19
    See application file for complete search history.

(56) References Cited

U.S. PATENT DOCUMENTS

| | | | |
|---|---|---|---|
| 4,631,106 A | 12/1986 | Nakazato et al. |
| 5,795,451 A | 8/1998 | Tan et al. |
| 6,132,576 A | 10/2000 | Pearson |
| 7,179,351 B1 | 2/2007 | Juliano et al. |
| 8,157,974 B2 | 4/2012 | Kutsuzawa et al. |
| 8,580,094 B2 | 11/2013 | Wang et al. |
| 8,597,479 B2 | 12/2013 | Harada et al. |
| 9,028,659 B2 | 5/2015 | Ritchie et al. |
| 9,646,843 B2 | 5/2017 | Nguyen et al. |
| 9,812,303 B2 | 11/2017 | Ritchie et al. |
| 9,991,101 B2 | 6/2018 | Johanson et al. |
| 10,283,331 B2 | 5/2019 | Miller |
| 10,504,705 B2 | 12/2019 | Behara et al. |

(Continued)

FOREIGN PATENT DOCUMENTS

| CN | 106637109 A | 5/2017 |
|---|---|---|
| KR | 20140080154 A | 6/2014 |
| WO | WO 2016/114229 A1 * | 11/2006 |

OTHER PUBLICATIONS

Machine Translation WO 2006/114229 A1 (Year: 2006).*
International Search Report and Written Opinion dated Mar. 26, 2024 for Application No. PCT/US2023/081105.

*Primary Examiner* — Rodney G McDonald
(74) *Attorney, Agent, or Firm* — Patterson + Sheridan, LLP

(57) ABSTRACT

A magnet assembly for a magnetron of a processing chamber includes a support member. A plurality of magnetic tracks is mounted to the support member. Each magnetic track includes a pair of magnetic poles. A partial magnetic track is mounted to the support member. The partial magnetic track includes a single unpaired magnetic pole. The partial magnetic track is mounted proximal to a center of rotation of the support member.

16 Claims, 7 Drawing Sheets

(56) References Cited

U.S. PATENT DOCUMENTS

| | | | |
|---|---|---|---|
| 2004/0050690 A1* | 3/2004 | Green | H01J 37/3408 204/192.12 |
| 2007/0108041 A1 | 5/2007 | Guo | |
| 2010/0252417 A1 | 10/2010 | Allen et al. | |
| 2011/0311735 A1 | 12/2011 | Wang et al. | |
| 2014/0042023 A1 | 2/2014 | Ritchie et al. | |
| 2019/0244796 A1 | 8/2019 | Yang et al. | |

* cited by examiner

MAGNETRON DESIGN FOR IMPROVED BOTTOM COVERAGE AND UNIFORMITY

CROSS-REFERENCE TO RELATED APPLICATIONS

This application claims the benefit of U.S. provisional patent application No. 63/448,974; filed Feb. 28, 2023; which is incorporated herein by reference in its entirety.

BACKGROUND

Field

Embodiments of the present disclosure generally relate to physical vapor deposition substrate processing systems.

Description of the Related Art

Two approaches for depositing ionized metals include direct current physical vapor deposition (DC PVD) and radio frequency (RF) PVD. The DC PVD process is characterized by a spacing between a substrate support surface of a substrate support and an opposing target containing material to be deposited on a substrate supported by the substrate support of about 190 to about 400 mm, referred to herein as tall spacing. The DC PVD process further uses a small unbalanced magnetron in a closed loop and operates at a relatively low pressure and high power. The combination of small magnetron and high DC power generates a large power density to ionize the gas medium and sputter the target. The low pressure and tall spacing provide a 'ballistic' transport mechanism where sputter material can reach the wafer with few if any in-flight collisions. Additional neutral metal is mainly deposited on the shields due to cosine type distribution and the tall spacing.

However, the inventors have observed that the small strong magnetron has a large drawback of localized sputtering. This localized sputtering will quickly erode the target at certain locations due to the electron confinement and localized gas ionization. This uneven erosion effect is further accelerated when magnetic materials such as cobalt (Co) and nickel (Ni) and their alloys are sputtered. In such cases a very strong magnet is used as some of the magnetic flux will be shunted into the magnetic material of the target. As the target is eroded the effective magnetic field at the front face of the target increases, which further accelerates the process. One complex method currently used in DC PVD processes is to use a position controlled magnet which is capable of moving location to more efficiently erode a larger area of the target. However, the tall spacing still results in an inefficient process as most of the sputtered material is deposited on the shields or collimator if utilized.

Uneven erosion of the target can lead to uneven deposition of target material on a substrate and inconsistent deposition results across successive substrates. Targets suffering uneven erosion have shorter useful lives than targets undergoing more even erosion, which adversely affects maintenance intervals for the PVD chambers.

Some RF PVD process chambers also use a tall spacing and a driving frequency of (for example) 13.56-27.12 MHz operated in a pressure regime of (for example) 20-60 mTorr. The inclusion of RF can open the window to increase target utilization without sacrificing metal ionization. For example, metal ionization is higher for RF PVD than DC PVD processes. Electron confinement is enhanced and consequently gas ionization by the confinement of electrons due to stochastic heating from the oscillating field is predominantly in the Ez direction. This permits greater flexibility of the type of magnetron that can be used. For example, the magnetron track in an RF PVD system does not need to be closed, unlike a DC PVD magnetron which does need to be closed. In addition, the RF PVD magnetron can be larger than the DC PVD magnetron and still achieve high metal ionization levels at the wafer.

However at 190 mm spacing, the inventors have observed that in order to achieve good deposition uniformity on the substrate, the magnetic field must be predominantly produced at the target edge. This poses an issue in that the target is predominantly eroded at the target edge and, as mentioned previously with magnetic materials, the uneven erosion of the target is pronounced.

Accordingly, there is a need for improved magnetrons for use in substrate processing systems.

SUMMARY

The present disclosure generally relates to physical vapor deposition substrate processing systems, and particularly to magnet assemblies suitable for use in a magnetron. In one embodiment, a magnet assembly includes a support member. A plurality of magnetic tracks is coupled to the support member. Each magnetic track includes a first pole piece coupled to a pair of magnetic poles. A first magnetic pole of each pair of magnetic poles includes a first array of magnets, and a second magnetic pole of each pair of magnetic poles includes a second pole piece coupled to a second array of magnets. A partial magnetic track is coupled to the support member. The partial magnetic track includes an unpaired magnetic pole that includes a third pole piece coupled to a third array of magnets.

In another embodiment, a magnet assembly includes a support member. A first magnetic track is coupled to the support member. The first magnetic track includes a first magnetic pole that includes a first array of magnets arranged in a first line forming a first arc. The first magnetic track includes a second magnetic pole that includes a second array of magnets arranged in a second line forming a second arc. The first and second magnetic poles are positioned side-by-side such that a separation between the first and second lines is constant along a length of the second line. A partial magnetic track is coupled to the support member, and includes an unpaired magnetic pole. The unpaired magnetic pole includes a third array of magnets arranged in a third line forming an arc.

In another embodiment, a substrate processing system includes a process chamber. The process chamber includes an inner volume and a substrate support disposed therein. A target assembly is disposed in the inner volume and facing the substrate support. A magnetron is disposed proximal to the target assembly on a side opposite the substrate support. The magnetron includes a magnet assembly that includes a support member. A plurality of magnetic tracks is coupled to the support member. Each magnetic track includes a pair of magnetic poles. A first magnetic pole of each pair of magnetic poles includes a first pole piece coupled to a first array of magnets, and a second magnetic pole of each pair of magnetic poles includes a second pole piece coupled to a second array of magnets. A partial magnetic track is coupled to the support member. The partial magnetic track includes an unpaired magnetic pole that includes a third pole piece coupled to a third array of magnets.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of the scope of the disclosure, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
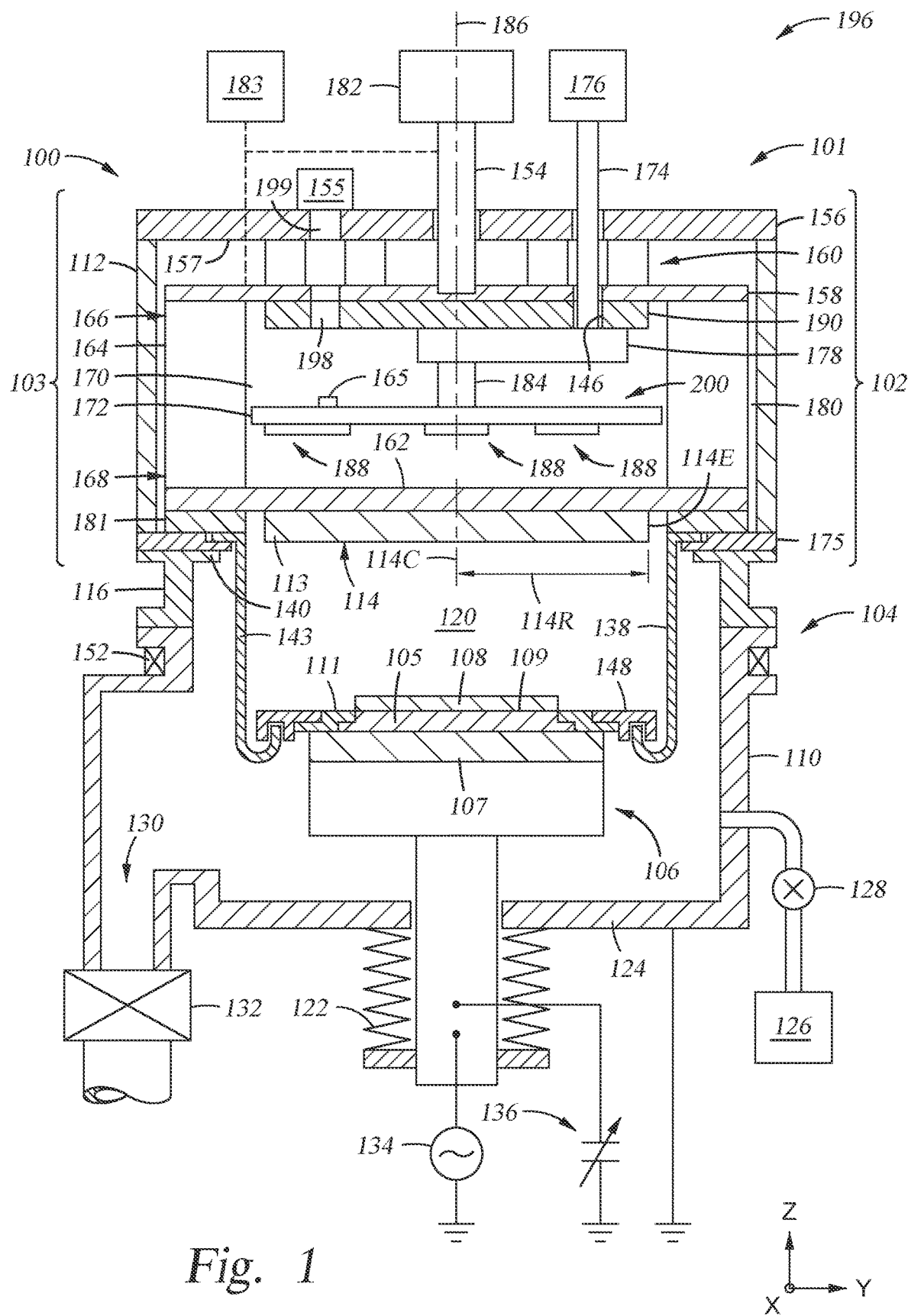
FIG. 1 depicts a schematic cross sectional view of a physical vapor deposition (PVD) process chamber in accordance with some embodiments of the present disclosure.

Embodiments of magnetrons suitable to provide extended target life in radio frequency (RF) plasmas are provided herein. In some embodiments, the present disclosure provides new apparatus and methods to control film uniformity whilst greatly extending the target life in an RF plasma. In some embodiments, the present disclosure may facilitate one or more of very high target utilization (e.g., 300-800% improvement as compared to target utilization in conventional DC PVD process chambers), more uniform metal ionization, and more uniform deposition on a substrate.

In high pressure RF PVD secondary electron confinement is achieved through oscillation of Ez due to the time varying nature of the RF period and minimal diffusive losses. This provides the main ionization mechanism at the target "cathode" surface, and controls the sputtering of metal from the target. Operating at a high gas pressure (e.g., 40-400 mTorr) enables a two mechanism collisional process to play a role to enable a high metal ionization at the wafer: "electron impact" and "penning ionization," with the latter dominating in this setup. However, a magnetron is needed in RF PVD to produce uniform deposition of the sputtered material. In an exemplary application, a magnetic material may be sputtered by a driving frequency of about 40 MHZ, which is in the VHF band. As used herein, a VHF frequency is a frequency in the range of from about 27 MHz to about 100 MHz. The geometry of the chamber may be smaller than a typical RF PVD process chamber. In an example, the target may be about one inch (about 25.4 mm) smaller in diameter than a conventional target, and the target-to-wafer spacing may be halved to about 95 mm. In another example that may be combined with other examples, the target may be sized similarly to a conventional target. In another example that may be combined with other examples, the target-to-wafer spacing is from 95 mm to 190 mm, such as from 110 mm to 180 mm, from 130 mm to 160 mm, from 140 mm to 150 mm, or about 145 mm. Apparatus in accordance with the present disclosure may provide a higher ionization rate than that shown for conventional RF PVD systems. In addition, the magnetron design disclosed herein may facilitate very high target utilization, as discussed in greater detail below.

In some embodiments, reducing the target-to-wafer spacing of the chamber, such as by half, allows the target utilization to increase (roughly equal to the inverse of spacing) as more of the sputtered metal arrives at the substrate. However, to further maximize the target utilization, a magnetron design is provided that can permit more uniform full face erosion without sacrificing desired metal ionization or deposition uniformity. This is not possible in conventional DC PVD or RF PVD process chambers, but has been demonstrated in an exemplary RF PVD process chamber having a magnetron design as described herein.

In some embodiments that may be combined with other embodiments, the use of a magnetron design as described herein enables the target-to-wafer spacing to be increased while realizing the benefits of a more uniform metal ionization and erosion from the target.

The magnetron design consists of a plurality of distinct magnetic tracks (e.g., four magnetic tracks) which are open loop. The magnetic tracks are spaced from near the center to very near the edge. One design utilizes four magnetic tracks where the magnetic tracks have a fixed radius and the length of each track varies as a function of the radial position of the track (e.g., shorter magnetic tracks closer to the center and longer magnetic tracks closer to the edge). In some embodiments, each of the four magnetic tracks are equal in terms of the track length/radial distance, which advantageously facilitates providing more even target erosion. Such a track configuration provides full face erosion and almost uniform full face erosion. This is a significant breakthrough as target utilization is a key metric specified by customers, and is becoming even more important with the increase in use of rare earth materials.

Magnetron designs in accordance with embodiment of the present disclosure are described below with respect to an illustrative, but non-limiting, PVD process chamber in FIG. 1, and in greater detail in subsequent figures.

FIG. 1 depicts a simplified, cross-sectional view of an illustrative PVD process chamber 100 having a magnetron assembly in accordance with some embodiments of the present disclosure. The specific configuration of the PVD process chamber is illustrative, and PVD process chambers having other configurations may also benefit from modification in accordance with the teachings provided herein. Examples of commercially available PVD process chambers suitable for modification in accordance with the teachings provided herein include the ALPS® Plus, SIP ENCORE®, and Endura® Cirrus™ PVD processing chambers, which are commercially available from Applied Materials, Inc., of Santa Clara, Calif. Other processing chambers from Applied Materials, Inc. or other manufacturers may also benefit from modifications in accordance with the inventive apparatus disclosed herein.

In some embodiments of the present disclosure, the PVD process chamber 100 includes a chamber lid 101 disposed atop a chamber body 104 and removable from the chamber body 104. The chamber lid 101 generally includes a target assembly 102 and a grounding assembly 103. The chamber body 104 contains a substrate support 106 for receiving a substrate 108 thereon. The substrate support 106 is configured to support a substrate such that a center of the substrate is aligned with a central axis 186 of the PVD process chamber 100. The substrate support 106 may be located within a lower grounded enclosure wall 110, which may be a wall of the chamber body 104. In some embodiments, the lower grounded enclosure wall 110 is electrically coupled to the grounding assembly 103 of the chamber lid 101 such that an RF return path is provided to an RF power source 182 disposed above the chamber lid 101. Alternatively, other RF return paths are contemplated, such as those that travel from the substrate support 106 via a process kit shield (e.g., a shield 138 as discussed below) and ultimately back to the grounding assembly 103 of the chamber lid 101. The RF power source 182 provides RF energy to the target assembly 102 as discussed below.

The substrate support 106 has a material-receiving surface facing a principal surface of a target 114 and supports the substrate 108 to be sputter coated with material ejected from the target in planar position opposite to the principal surface of the target 114. In some embodiments, the substrate support 106 includes a dielectric member 105 having a substrate processing surface 109 for supporting the substrate 108 thereon. In some embodiments, the substrate support 106 includes one or more conductive members 107 disposed below the dielectric member 105. For example, the dielectric member 105 and the one or more conductive members 107 may be part of an electrostatic chuck, RF electrode, or the like, which may be used to provide chucking or RF power to the substrate support 106.

The substrate support 106 provides support to the substrate 108 in a first volume 120 of the chamber body 104. The first volume 120 is a portion of the inner volume of the chamber body 104 that is used for processing the substrate 108 and may be separated from the remainder of the inner volume (e.g., a non-processing volume) during processing of the substrate 108 (for example, via the shield 138). The first volume 120 is defined as the region above the substrate support 106 during processing (for example, between the target 114 and the substrate support 106 when in a processing position).

In some embodiments, the substrate support 106 is vertically movable to allow the substrate 108 to be transferred onto the substrate support 106 through an opening (such as a slit valve, not shown) in the lower portion of the chamber body 104 and thereafter raised to a processing position. A bellows 122 connected to a bottom chamber wall 124 may be provided to maintain a separation of the inner volume of the chamber body 104 from the atmosphere outside of the chamber body 104. One or more gases are supplied from a gas source 126 through a mass flow controller 128 into the lower part of the chamber body 104. An exhaust port 130 is provided and coupled to a pump (not shown) via a valve 132 for exhausting the interior of the chamber body 104 and to facilitate maintaining a desired pressure inside the chamber body 104.

In some embodiments, an RF bias power source 134 is coupled to the substrate support 106 in order to induce a negative DC bias on the substrate 108. In addition, in some embodiments, a negative DC self-bias may form on the substrate 108 during processing. In some embodiments, RF energy supplied by the RF bias power source 134 may range in frequency from about 2 MHz to about 60 MHz. Exemplary, non-limiting, frequencies such as 2 MHZ, 13.56 MHZ, 40 MHz, or 60 MHz can be used. In other applications, the substrate support 106 may be grounded or left electrically floating. Alternatively or in combination, a capacitance tuner 136 may be coupled to the substrate support 106 for adjusting voltage on the substrate 108 for applications where RF bias power is not be desired.

The chamber body 104 further includes a process kit shield (such as shield 138) to surround the processing, or first volume, of the chamber body 104 and to protect other chamber components from damage and/or contamination from processing. In some embodiments, the shield 138 is coupled to a ledge 140 of an upper grounded enclosure wall 116 of the chamber body 104. In other embodiments, and as illustrated in FIG. 1, the shield 138 may be coupled to the chamber lid 101, for example via a support member 175.

The chamber lid 101 rests on the ledge 140 of the upper grounded enclosure wall 116. Similar to the lower grounded enclosure wall 110, the upper grounded enclosure wall 116 may provide a portion of the RF return path between the lower grounded enclosure wall 116 and the grounding assembly 103 of the chamber lid 101. However, other RF return paths are contemplated, such as via the grounded shield 138.

The shield 138 extends downwardly and may include one or more sidewalls 143 configured to surround the first volume 120. The shield 138 extends along, but spaced apart from, the walls of the upper grounded enclosure wall 116 and the lower grounded enclosure wall 110 downwardly to below a top surface of the substrate support 106, and returns upwardly towards the top surface of the substrate support 106 (e.g., forming a u-shaped portion at the bottom of the shield 138). A first ring 148 (e.g., a cover ring) rests on the top of the u-shaped portion (e.g., a first position of the first ring 148) when the substrate support 106 is in its lower, loading position (not shown) but rests on the outer periphery of the substrate support 106 (e.g., a second position of the first ring 148) when the substrate support 106 is in its upper, deposition position (as illustrated in FIG. 1) to protect the substrate support 106 from sputter deposition.

An additional dielectric ring 111 may be used to shield the periphery of the substrate 108 and/or the periphery of the substrate support 106 from deposition. For example, the dielectric ring 111 may be disposed about a peripheral edge of the substrate support 106 and adjacent to the substrate processing surface 109 as illustrated in FIG. 1.

When the first ring 148 is in the second position (e.g., when disposed on the outer periphery of the substrate support 106), a gap may be defined between the first ring 148 and the shield 138. In some embodiments, the gap may be less than about two plasma sheath widths for a plasma formed at a frequency of about 40 MHz or higher and at a pressure of about 140 mTorr or lower. In some embodiments, the width of the gap is less than about 6 millimeters (mm). In some embodiments, the gap has a length to width ratio of at least about 4:1. The inventors have discovered that, in some embodiments, a length to width ratio of at least about 4:1 may advantageously limit or prevent plasma formed in the first volume 120 from reaching a non-processing volume of the inner volume disposed below the substrate support 106.

In some embodiments, the first ring 148 may include protrusions extending from a lower surface of the first ring 148 on either side of the inner upwardly extending u-shaped portion of the bottom of the shield 138. An innermost protrusion may be configured to interface with the substrate support 106 to align the first ring 148 with respect to the shield 138 when the first ring 148 is moved into the second position as the substrate support is moved into the processing position. For example, a substrate support-facing surface of the innermost protrusion may be tapered, notched or the like to rest in/on a corresponding surface on the substrate support 106 when the first ring 148 is in the second position, such that the gap between the first ring 148 and the shield 138 is defined by the alignment of the first ring 148 to be configured as discussed above.

In some embodiments, a magnet 152 may be disposed about the chamber body 104 for selectively providing a magnetic field between the substrate support 106 and the target 114. For example, as shown in FIG. 1, the magnet 152 may be disposed about the outside of the enclosure wall 110 in a region just above the substrate support 106 when in processing position. In some embodiments, the magnet 152 may be disposed additionally or alternatively in other locations, such as adjacent the upper grounded enclosure wall 116. The magnet 152 may be an electromagnet and may be coupled to a power source (not shown) for controlling the magnitude of the magnetic field generated by the electromagnet.

The chamber lid 101 generally includes the grounding assembly 103 disposed about the target assembly 102. The grounding assembly 103 includes a grounding plate 156 having a first surface 157 that may be generally parallel to and opposite a backside of the target assembly 102. A grounding shield 112 extends from the first surface 157 of the grounding plate 156 and surrounds the target assembly 102. In some embodiments, the grounding assembly 103 includes a support member 175 to support the target assembly 102 within the grounding assembly 103.

In some embodiments, the support member 175 is coupled to a lower end of the grounding shield 112 proximate an outer peripheral edge of the support member 175, and extends radially inward to support a seal ring 181, the target assembly 102, and, optionally, a dark space shield (e.g., that may be disposed between the shield 138 and the target assembly 102, not shown). The seal ring 181 may be a ring or other annular shape having a desired cross-section. In some embodiments, the seal ring 181 includes two opposing planar and generally parallel surfaces to facilitate interfacing with the target assembly 102 (such as the backing plate 162) on a first side of the seal ring 181, and with the support member 175 on a second side of the seal ring 181. The seal ring 181 may be made of a dielectric material, such as ceramic. The seal ring 181 insulates the target assembly 102 from the ground assembly 103.

In some embodiments, the support member 175 is a generally planar member having a central opening to accommodate the shield 138 and the target 114. In some embodiments, the support member 175 is circular, or disc-like in shape, although the shape may vary depending upon the corresponding shape of the chamber lid and/or the shape of the substrate to be processed in the PVD process chamber 100. In use, when the chamber lid 101 is opened or closed, the support member 175 maintains the shield 138 in proper alignment with respect to the target 114, minimizing the risk of misalignment due to chamber assembly or opening and closing the chamber lid 101.

The target assembly 102 includes a source distribution plate 158 opposing a backside of the target 114 and electrically coupled to the target 114 along a peripheral edge of the target 114. The target 114 includes a target source material 113 to be deposited on a substrate, such as the substrate 108, during sputtering. Exemplary target materials 113 include a metal, metal oxide, metal alloy, magnetic material, or the like. In some embodiments, the target 114 includes a backing plate 162 to support the target source material 113. The target source material 113 is disposed on a substrate support-facing side of the backing plate 162, as illustrated in FIG. 1. In some embodiments, the backing plate 162 comprises a conductive material, such as copper-zinc, copper-chrome, or the same material as the target, such that RF, and optionally DC, power can be coupled to the target source material 113 via the backing plate 162. Alternatively, the backing plate 162 may be non-conductive and may include conductive elements (not shown) such as electrical feedthroughs or the like.

In some embodiments, a conductive member 164 is disposed between the source distribution plate 158 and the backside of the target 114 to propagate RF energy from the source distribution plate 158 to the peripheral edge of the target 114. The conductive member 164 may be cylindrical and tubular, with a first end 166 coupled to a target-facing surface of the source distribution plate 158 proximate the peripheral edge of the source distribution plate 158 and a second end 168 coupled to a source distribution plate-facing surface of the target 114 proximate the peripheral edge of the target 114. In some embodiments, the second end 168 is coupled to a source distribution plate-facing surface of the backing plate 162 proximate the peripheral edge of the backing plate 162.

The target assembly 102 includes a cavity 170 disposed between the backside of the target 114 and the source distribution plate 158. The cavity 170 at least partially houses a magnetron assembly 196, as discussed below. The cavity 170 is at least partially defined by the inner surface of the conductive member 164, a target-facing surface of the source distribution plate 158, and a source distribution plate-facing surface (e.g., backside) of the target 114 (or backing plate 162). In some embodiments, the cavity 170 may be at least partially filled with a cooling fluid, such as water ($H_2O$) or the like. In some embodiments, a divider (not shown) may be provided to contain the cooling fluid in a desired portion of the cavity 170 (such as a lower portion) and to prevent the cooling fluid from reaching components disposed on the other side of the divider.

An insulative gap 180 is provided between the grounding plate 156 and the outer surfaces of the source distribution plate 158, the conductive member 164, and the target 114 (and/or backing plate 162). The insulative gap 180 may be at least partially filled with air or some other suitable dielectric material, such as a ceramic, a plastic, or the like. The distance between the grounding plate 156 and the source distribution plate 158 depends on the dielectric material between the grounding plate 156 and the source distribution plate 158. In some embodiments, where the dielectric material is predominantly air, the distance between the grounding plate 156 and the source distribution plate 158 may be between about 5 mm to about 40 mm.

In some embodiments, the grounding assembly 103 and the target assembly 102 are electrically separated by the seal ring 181 and by one or more of insulators 160 disposed between the first surface 157 of the grounding plate 156 and the backside of the target assembly 102, e.g., a non-target facing side of the source distribution plate 158.

The target assembly 102 has the RF power source 182 connected to an electrode 154 (e.g., a RF feed structure). The RF power source 182 may include an RF generator and a matching circuit, for example, to minimize reflected RF energy reflected back to the RF generator during operation. For example, RF energy supplied by the RF power source 182 may range in frequency from about 13.56 MHz and to about 200 MHz or above. Exemplary, non-limiting frequencies such as 13.56 MHz, 27.12 MHz, 40 MHZ, 60 MHZ, or 162 MHz can be used.

In some embodiments, a second energy source 183 may be coupled to the target assembly 102 to provide additional energy to the target 114 during processing. In some embodiments, the second energy source 183 may be a DC power source to provide DC energy, for example, to enhance a sputtering rate of the target material (and hence, a deposition rate on the substrate). In some embodiments, the second energy source 183 may be a second RF power source, similar to the RF power source 182, to provide RF energy, for example, at a second frequency different than a first frequency of RF energy provided by the RF power source 182. In embodiments where the second energy source 183 is a DC power source, the second energy source may be coupled to the target assembly 102 in any location suitable to electrically couple the DC energy to the target 114, such as the electrode 154 or some other conductive member (such as the source distribution plate 158). In embodiments where the second energy source 183 is a second RF power source, the second energy source may be coupled to the target assembly 102 via the electrode 154.

The electrode 154 may be cylindrical or otherwise rod-like and may be aligned with a central axis 186 of the PVD process chamber 100 (e.g., the electrode 154 may be coupled to the target assembly 102 at a point coincident with a central axis of the target 114, which is coincident with the central axis 186). The electrode 154, aligned with the central axis 186 of the PVD process chamber 100, facilitates applying RF energy from the RF power source 182 to the target 114 in an axisymmetric manner (e.g., the electrode 154 may couple RF energy to the target at a "single point" aligned with the central axis of the PVD process chamber). The central position of the electrode 154 helps to eliminate or reduce deposition asymmetry in substrate deposition processes. The electrode 154 may have any suitable diameter, however, the smaller the diameter of the electrode 154, the closer the RF energy application approaches a true single point. For example, although other diameters may be used, in some embodiments, the diameter of the electrode 154 may be about 0.5 to about 2 inches. The electrode 154 may generally have any suitable length depending upon the configuration of the PVD process chamber. In some embodiments, the electrode may have a length of between about 0.5 inches (about 12.7 mm) to about 12 inches (about 304.8 mm). The electrode 154 may be fabricated from any suitable conductive material, such as aluminum, copper, silver, or the like.

The electrode 154 passes through an opening in the grounding plate 156 and is coupled to the source distribution plate 158. The grounding plate 156 may comprise any suitable conductive material, such as aluminum, copper, or the like. Open spaces between the one or more insulators 160 allow for RF wave propagation along the surface of the source distribution plate 158. In some embodiments, the one or more insulators 160 may be symmetrically positioned with respect to the central axis 186 of the PVD process chamber 100. Such positioning may facilitate symmetric RF wave propagation along the surface of the source distribution plate 158 and, ultimately, to the target 114 coupled to the source distribution plate 158. The RF energy may be provided in a more symmetric and uniform manner as compared to conventional PVD process chambers due, at least in part, to the central position of the electrode 154.

One or more portions of a magnetron assembly 196 are disposed at least partially within the cavity 170. The magnetron assembly 196 provides a rotating magnetic field proximate the target 114 to assist in plasma processing within the process chamber 100. In some embodiments, the magnetron assembly 196 includes a motor 176, a motor shaft 174, a gearbox 178, a gearbox shaft 184, and a rotatable magnet (e.g., a magnet assembly 200 including a plurality of magnets 188 coupled to a magnet support member 172).

The magnetron assembly 196 is rotated within the cavity 170. For example, in some embodiments, the motor 176, motor shaft 174, gear box 178, and gearbox shaft 184 may be provided to rotate the magnet support member 172. In some embodiments (not shown), the magnetron drive shaft may be disposed along the central axis of the chamber, with the RF energy coupled to the target assembly at a different location or in a different manner. As illustrated in FIG. 1, in some embodiments, the motor shaft 174 of the magnetron assembly 196 may be disposed through an off-center opening in the grounding plate 156. The end of the motor shaft 174 protruding from the grounding plate 156 is coupled to a motor 176. The motor shaft 174 is further disposed through a corresponding off-center opening through the source distribution plate 158 (e.g., a first opening 146) and coupled to a gear box 178. In some embodiments, one or more second openings 198 may be disposed though the source distribution plate 158 in a symmetrical relationship to the first opening 146 to advantageously maintain axisymmetric RF distribution along the source distribution plate 158. The one or more second openings 198 may also be used to allow access to the cavity 170 for items such as sensors or the like.

As illustrated, in some embodiments, which may be combined with other embodiments, one or more of the second openings 198 may be aligned with an access 199 (such as a window or opening) in the grounding plate 156. A sensor 155 mounted to the chamber lid 101 (such as mounted to the grounding plate 156) aligned with the access 199 and the respective second opening 198 detects the presence or absence of a characteristic feature on or in the magnet support member 172 while the magnet support member 172 rotates. The characteristic feature may include a sensor target 165. In an example, the sensor target is a reflector, such as a quartz reflector. In such an example, the sensor 155 emits a beam of light. The light reflects off the sensor target 165 back to the sensor 155. The sensor detects the change of intensity of reflected light between instances (i) when the sensor target 165 is aligned with the sensor 155, the access 199, and the respective second opening 198; and (ii) when the sensor target 165 is not aligned with the sensor 155, the access 199, and the respective second opening 198. Measurements by the sensor 155 enable the speed of rotation of the magnet support member 172 to be monitored independently of inferring a speed of rotation via the motor 176.

The gear box 178 may be supported in any suitable manner, such as by being coupled to a bottom surface of the source distribution plate 158. The gear box 178 may be insulated from the source distribution plate 158 by fabricating at least the upper surface of the gear box 178 from a dielectric material, or by interposing an insulator layer 190 between the gear box 178 and the source distribution plate 158, or the like. The gear box 178 is further coupled to the magnet support member 172 via the gear box shaft 184 to transfer the rotational motion provided by the motor 176 to the magnet support member 172 (and hence, the plurality of magnets 188). In some embodiments, the gear box shaft 184 is coincident with the central axis 186 of the PVD process chamber 100. Such an arrangement promotes a uniform juxtaposition of the RF energy in the cavity 170 with the magnetic field that is created by rotating the magnet assembly 200.

The magnet support member 172 may be constructed from any material suitable to provide adequate mechanical strength to rigidly support the plurality of magnets 188. For example, in some embodiments, the magnet support member 172 may be constructed from a non-magnetic metal, such as non-magnetic stainless steel. The magnet support member 172 may have any shape suitable to allow the plurality of magnets 188 to be coupled thereto in a desired position. For example, in some embodiments, the magnet support member 172 may comprise a plate, a disk, a cross member, or the like. The plurality of magnets 188 may be configured in any manner to provide a magnetic field having a desired shape and strength to provide a more uniform full face erosion of the target as described herein.

In some embodiments, as an alternative to (or in addition to) the depicted arrangement described above, the magnet support member 172 may be rotated by any other arrangement that provides sufficient torque to overcome the drag caused on the magnet support member 172 and attached plurality of magnets 188. Such drag may, for example, be due to the cooling fluid, when present, in the cavity 170. In an example, in some embodiments, (not shown), the magnetron assembly 196 may be rotated within the cavity 170 using another motor and motor shaft (or the motor 176 and motor shaft 174) disposed within the cavity 170 and directly connected to the magnet support member 172. Such an example may include a pancake motor arrangement. In such an example, the other motor (or the motor 176) must be sized sufficiently to fit within the cavity 170, or within the upper portion of the cavity 170 when the divider is present. The motor 176 and any other motor disposed within the cavity 170 may be an electric motor, a pneumatic or hydraulic drive, or any other process-compatible mechanism that can provide the required torque.

Figure 2:
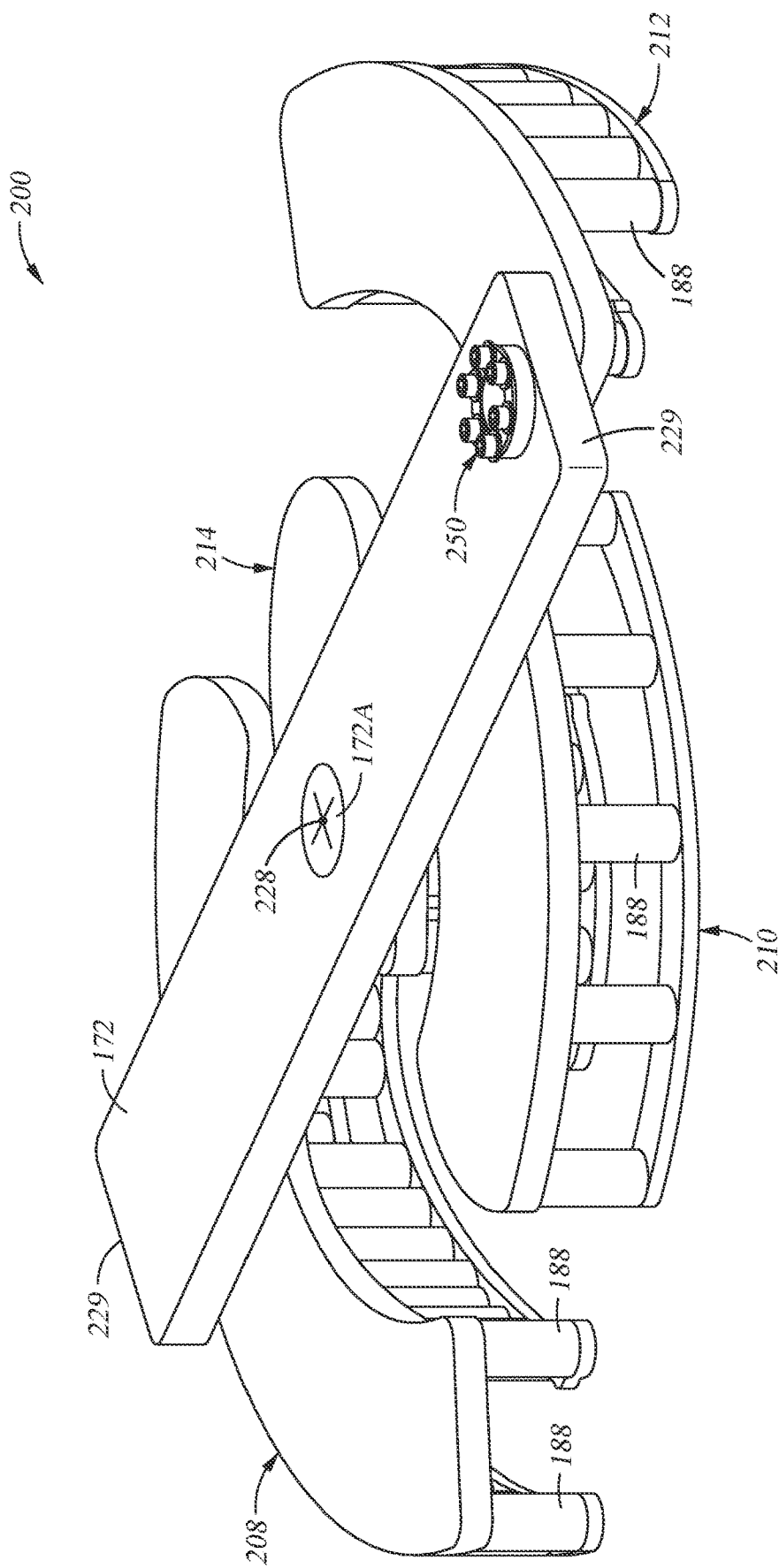
FIG. 2 depicts a schematic top isometric view of a magnet assembly for use in a PVD process chamber in accordance with some embodiments of the present disclosure.
Figure 3:
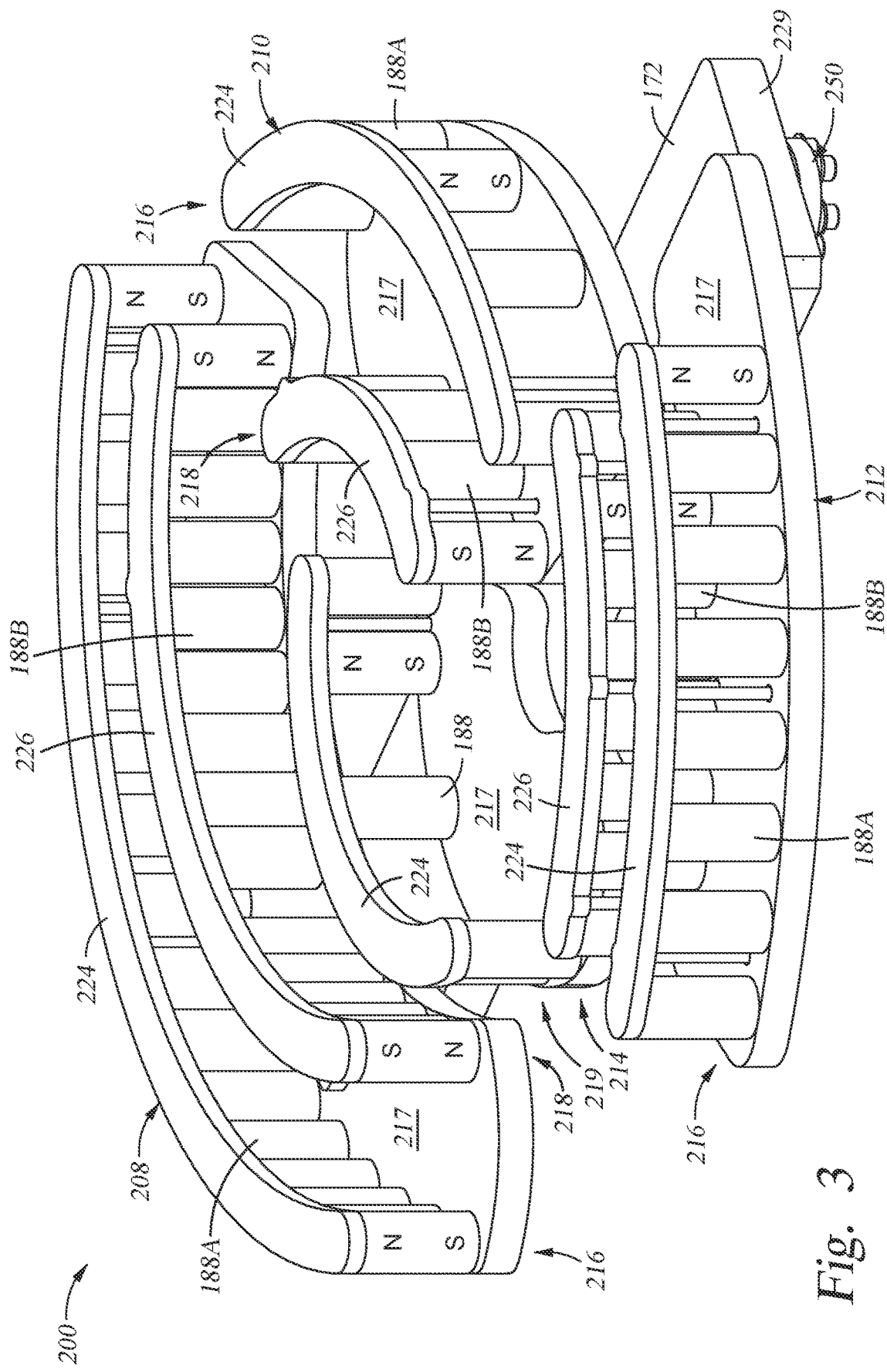
FIG. 3 depicts a schematic bottom isometric view of the magnet assembly of FIG. 2.
Figure 4:
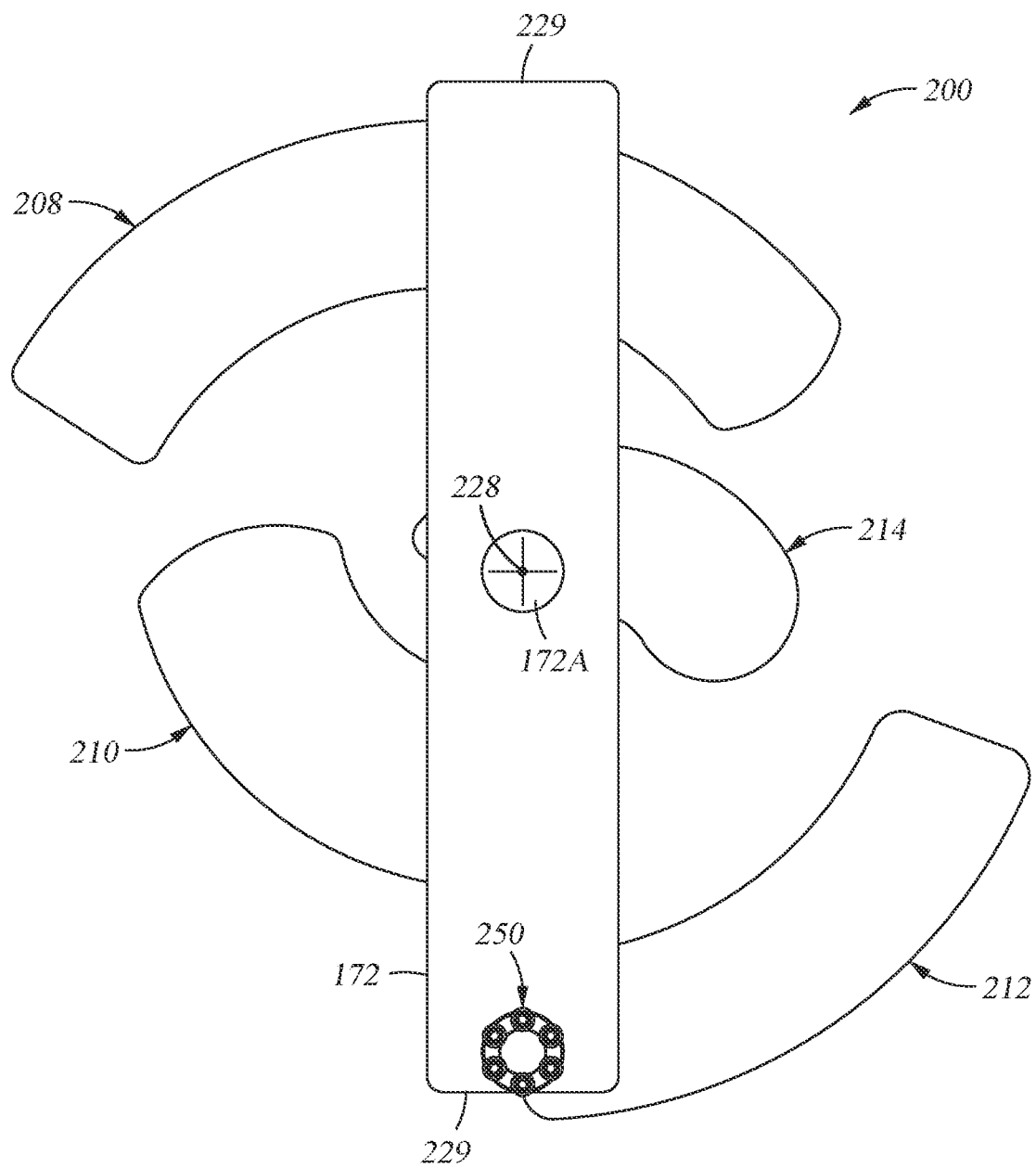
FIG. 4 depicts a schematic top view of the magnet assembly of FIG. 2.
Figure 5:
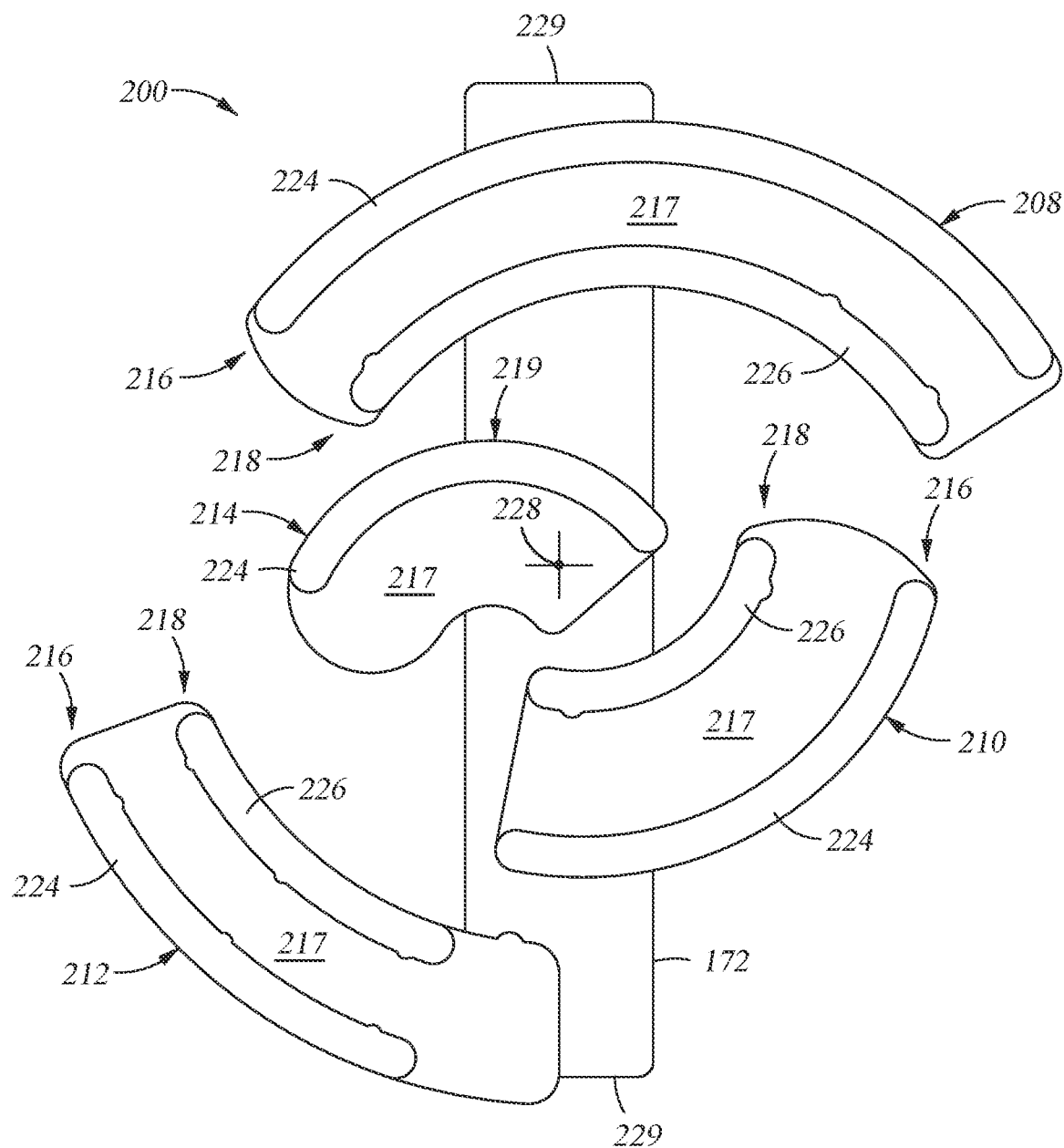
FIG. 5 depicts a schematic bottom view of the magnet assembly of FIG. 2.
Figure 6:
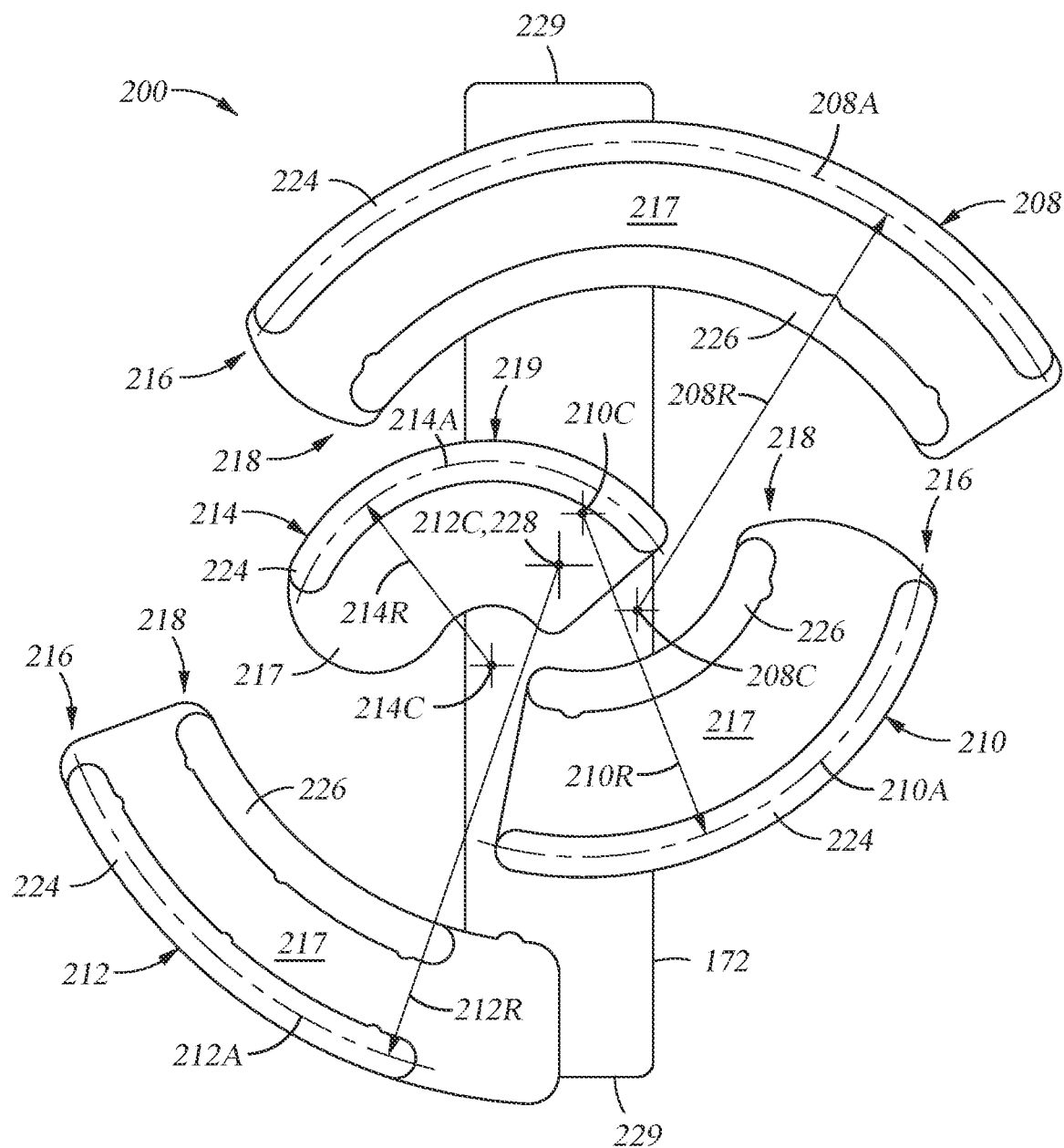
FIG. 6 depicts the same view as in FIG. 5, highlighting additional aspects.
Figure 6:
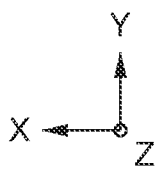

FIGS. 2 and 3 depict, respectively, schematic top and bottom isometric views of a magnet assembly 200 (e.g., a configuration of the plurality of magnets 188 of the magnetron) for use in a PVD process chamber in accordance with some embodiments of the present disclosure. FIGS. 4 to 6 depict, schematic top (FIG. 4) and bottom (FIGS. 5 and 6) views of the magnet assembly 200. As shown in FIGS. 2 to 6, the plurality of magnets 188 are coupled to the magnet support member 172, which serves as a structural base for the magnet assembly 200. The magnet support member 172 may be fabricated of a suitable material to be a shunt plate that shunts the magnetic field. The magnet support member 172 may also include a central opening 172A (FIG. 2) and a mounting plate (e.g., shaft clamp assembly (not shown)) for mounting the magnet support member 172 to a shaft to provide rotation of the magnetron during use, for example, such as the rotation shaft 184 as shown in FIG. 1. For clarity of discussion purposes, and as illustrated in FIG. 1, the axis of the rotation shaft 184 is shown as being parallel to the Z-axis. In some embodiments, the central opening 172A may be coincident with a center of rotation 228 of the magnet support member 172.

The plurality of magnets 188 are arranged into a plurality of distinct pairs of open loop magnetic poles and a single ("stand-alone," "unpaired," or "partial pair") open loop magnetic pole coupled to the magnet support member 172. The pairs and partial pair may be coupled to the magnet support member 172, for example, via a plurality of mounting holes formed in the magnet support member 172. In the embodiment depicted in FIGS. 2 to 5 three magnetic tracks 208, 210, 212 and one partial magnetic track 214 are shown. Each magnetic track 208, 210, 212 includes a pair of open loop magnetic poles, whereas the partial magnetic track 214 includes an unpaired single open loop magnetic pole without a corresponding second open loop magnetic pole. The magnetic tracks 208, 210, 212 and the partial magnetic track 214 are spaced from near the center (such as the center of rotation 228) to near the radially distal edge 229 of the magnet support member 172. By providing a plurality of magnetic tracks spaced on the magnet support member 172 from near the center to near the radially distal edge 229 of the magnet support member 172, a magnetic field may be produced that covers or substantially covers the full face of the target 114. As illustrated, in some embodiments that may be combined with other embodiments, one or more of the magnetic tracks 208, 210, 212 or the partial magnetic track 214 may be curved. In some embodiments that may be combined with other embodiments, one or more of the magnetic tracks 208, 210, 212, or the partial magnetic track 214 may be straight.

Each of the three magnetic tracks 208, 210, 212 may generally be positioned with one magnetic track near the center of the magnet support member 172, such as near the center of rotation 228 (e.g., near the center of the target source material 113), and two magnetic tracks in positions corresponding to the outer edge of the target source material 113. In the illustrated example, magnetic track 210 is positioned near the center of rotation 228, magnetic track 212 is positioned at the radially distal edge 229 of the magnet support member 172, and magnetic track 208 is positioned at an intermediate location between the center of rotation 228 and the radially distal edge 229 of the magnet support member 172. In some embodiments, the magnetic track positioned near the center of the magnet support member 172 may have the poles disposed on either side of the center of the magnet support member, but with neither pole directly over the center. Any additional magnetic tracks may be positioned to fill the spaces in between the center and radially distal edge 229 of the magnet support member 172.

In some embodiments, the magnetic tracks 208, 210, 212 and the partial magnetic track 214 may have a length that varies as a function of the radial location of the track with respect to the center of rotation 228. In some embodiments, a ratio of track length to the radial distance of the track from the center of rotation 228 of the magnet support member 172 is substantially equal for each of the magnetic tracks 208, 210, 212 and the partial magnetic track 214. This may advantageously provide a more uniform erosion of the target 114 compared to conventional arrangements.

Each pair of open loop magnetic poles of each magnetic track 208, 210, 212 includes a first open loop magnetic pole (e.g., 216) and a second open loop magnetic pole (e.g., 218). As illustrated, the first and second open loop magnetic pole 216, 218 are mounted to a shunt plate 217. The shunt plate 217 is mounted to the magnetic support member 172. In some embodiments, which may be combined with other embodiments, the magnetic support member 172 may be a unitary structure that includes the shunt plate 217. The first open loop magnetic pole 216 includes a first pole piece 224, which may be formed in the shape of an arc, and a plurality of magnets 188A are disposed between the first pole piece 224 and the shunt plate 217 that is coupled to the magnetic support member 172. The second open loop magnetic pole 218 includes a second pole piece 226, which may be formed in the shape of an arc. A plurality of magnets 188B are disposed between the second pole piece 226 and the shunt plate 217.

As illustrated, the first and second magnetic poles 216, 218 of each magnetic track 208, 210, 212 are parallel to each other. For example, in each magnetic track 208, 210, and 212, the plurality of magnets 188A is arranged as a first line of magnets, the plurality of magnets 188B is arranged as a second line of magnets, and the first and second lines of magnets are parallel to each other. In each magnetic track 208, 210, and 212, the second open loop magnetic pole 218 is spaced a first distance from the first open loop magnetic pole 216 in a direction that is parallel to a first plane that is parallel the X-Y plane in FIGS. 4 to 6. Additionally, the first distance is constant throughout the length of at least one of the first open loop magnetic pole 216 or the second open loop magnetic pole 218.

In some embodiments, which may be combined with other embodiments, in any one of the magnetic tracks 208, 210, 212, the magnets 188A or 188B may be distributed along an entire length of the respective first or second pole piece 224, 226. In some embodiments, which may be combined with other embodiments, in any one of the magnetic tracks 208, 210, 212, the magnets 188A or 188B may not be distributed along an entire length of the respective first or second pole piece 224, 226. For example, the number and/or distribution of magnets 188A, 188B about the length of the corresponding first or second pole piece 224, 226 may be adjusted to change magnetic field strength and/or facilitate improved target lifetime and/or deposition uniformity. In some embodiments, where the plurality of magnets are not distributed along the entire length of the first or second pole piece, one or more spacers (not shown) may be provided to support the ends of the respective pole piece 224, 226. However, the overall magnetic strength of each of the first and second open loop magnetic poles 216, 218 may be the same or substantially the same. For example, a balance ratio (i.e., a ratio of the magnetic field strength of the inner pole, such as second open loop magnetic pole 218, to the outer pole, such as first open loop magnetic pole 216) may be between about 0.75 to about 1.25, or in some embodiments, about 1. Providing a more balanced ratio of magnetic field strengths advantageously minimizes magnetic field lines extending in the z direction (e.g., perpendicular to the magnet support member 172).

In some embodiments, the magnetic field provided by the magnetron assembly 196 is relatively weak, meaning just strong enough to provide confinement. For use with magnetic target materials, the magnetic field may be stronger, and for use with non-magnetic target materials, the magnetic field may be weaker. Similarly, the spacing between pairs of poles 216, 218 in a given magnetic track (such as magnetic track 208, 210, or 212) may be selected based upon the overall thickness of the target 114 (e.g., the target source material 113 alone, or the target source material 113 plus the backing plate 162). In some embodiments, which may be combined with other embodiments, the overall thickness of the target 114 may be about one inch (about 25.4 mm). The spacing may be selected such that the magnetic field extends just to the face of the target source material 113 that faces the substrate 108, or slightly into the processing volume 120 beyond the face of the target source material 113.

Generally, the first and second pole pieces 224, 226 may be fabricated from a ferromagnetic material, such as in a non-limiting example, 400-series stainless steel or other suitable materials. The arc lengths of each of the first and second pole pieces 224, 226 (defined in terms of the angle traversed by a radius) may range from about 45 degrees to about 180 degrees, or from about 80 to about 100 degrees, or about 90 degrees. The above description with respect to the pair of magnetic tracks 210 also applies to the remaining pairs of magnetic tracks as well.

The polar orientation, or polarity (e.g., north or south), of each magnet 188A, 188B within a given pole in any pair of open loop magnetic poles is the same (e.g., the magnets within a given open loop magnetic pole have a common polar orientation), but the polarity between pairs of magnetic poles 216, 218 of the same magnetic track 208, 210, or 212 is opposite (e.g., inner north and outer south or inner south and outer north). In the illustrated example, each magnet 188A of the first open loop magnetic pole 216 is oriented with the south pole proximal to the shunt plate 217, whereas each magnet 188B of the second open loop magnetic pole 218 is oriented with the north pole proximal to the shunt plate 217.

The partial magnetic track 214 includes a single open loop magnetic pole 219 arranged similarly to the first open loop magnetic pole 216. In the illustrated example, each magnet 188 of the single open loop magnetic pole 219 is oriented with the south pole proximal to the shunt plate 217. In other (non-illustrated) examples, the polar orientations of each magnet 188, 188A, 188B may be reversed.

As illustrated, the shunt plate 217 of the partial magnetic track 214 includes provision to accommodate a second open loop magnetic pole, even though the second open loop magnetic pole is absent. In some embodiments, which may be combined with other embodiments, the shunt plate 217 of the partial magnetic track 214 does not include provision to accommodate a second open loop magnetic pole.

The partial magnetic track 214 is mounted to the magnet support member 172 proximal to the center of rotation 228 of the magnet support member 172. Each of the three magnetic tracks 208, 210, 212 are mounted to the magnet support member 172 at progressive distances from the partial magnetic track 214 to the radially distal edge 229 of the magnet support member 172. As illustrated, at least a portion of the partial magnetic track 214 is mounted to the magnet support member 172 between two magnetic tracks 208, 210. In this embodiment, the partial magnetic track 214 is located closer to the second open loop magnetic pole track 218 of each of the magnetic tracks 208, 210 than to the first loop magnetic pole track 216 of each of the magnetic tracks 208, 210. The polar orientation of the magnets 118 of the partial track 214 is opposite to the polar orientation of the magnets 118B of the magnetic tracks 208, 210. As illustrated, in some embodiments, at least a portion of the second open loop magnetic pole 218 of the magnetic track 208 is adjacent to at least a portion of the open loop magnetic pole 219 of the partial magnetic track 214. As illustrated, in some embodiments, at least a portion of the second open loop magnetic pole 218 of the magnetic track 210 is adjacent to at least a portion of the open loop magnetic pole 219 of the partial magnetic track 214. In some embodiments, which may be combined with other embodiments, the magnetic tracks 208, 210, 212 and the partial magnetic track 214 are arranged such that the polarity of the magnets 188, 188A, 188B of any one magnetic pole 216, 218, 219 is opposite to the polarity of the magnets 188, 188A, 188B in the nearest adjacent magnetic pole 216, 218, 219.

In some embodiments, which may be combined with other embodiments, the magnetic tracks 208, 210, 212 and the partial magnetic track 214 are arranged such that the magnet assembly 200 is balanced for rotation about the center of rotation 228. In some of such embodiments, a separate counterbalance may be omitted. In others of such embodiments, a separate counterbalance may be present.

FIG. 6 depicts the same view of the magnet assembly 200 as in FIG. 5, and highlights additional aspects of an embodiment that may be combined with other embodiments. A center line 214A of the magnets 188 (shown in FIG. 3) of the open loop magnetic pole 219 of partial magnetic track 214 is in the form of an arc. The arc is defined by a radius 214R from a center point 214C. The center point 214C is in a location different from the center of rotation 228 of the magnet support member 172. In other words, the center point 214C is not coincident with the center of rotation 228 of the magnet support member 172.

A center line 208A of the magnets 188A (shown in FIG. 3) of the first open loop magnetic pole 216 of magnetic track 208 is in the form of an arc. The arc is defined by a radius 208R from a center point 208C. The center point 208C is in a location different from the center of rotation 228 of the magnet support member 172. In other words, the center point 208C is not coincident with the center of rotation 228 of the magnet support member 172. As illustrated, the center point 208C is not coincident with the center point 214C.

A center line 210A of the magnets 188A (shown in FIG. 3) of the first open loop magnetic pole 216 of magnetic track 210 is in the form of an arc. The arc is defined by a radius 210R from a center point 210C. The center point 210C is in a location different from the center of rotation 228 of the magnet support member 172. In other words, the center point 210C is not coincident with the center of rotation 228 of the magnet support member 172. As illustrated, the center point 210C is not coincident with the center point 208C. As illustrated, the center point 210C is not coincident with the center point 214C.

A center line 212A of the magnets 188A (shown in FIG. 3) of the first open loop magnetic pole 216 of magnetic track 212 is in the form of an arc. The arc is defined by a radius 212R from a center point 212C. The center point 212C is in the same location as the center of rotation 228 of the magnet support member 172. In other words, the center point 212C is coincident with the center of rotation 228 of the magnet support member 172. As illustrated, the center point 212C is not coincident with the center point 208C. As illustrated, the center point 212C is not coincident with the center point 210C. As illustrated, the center point 212C is not coincident with the center point 214C.

As illustrated, in some embodiments that may be combined with other embodiments, radius 208R may be a fixed value. For example, the magnitude of radius 208R from the center point 208C to any location on the center line 208A is a constant value. However, in alternative embodiments that may be combined with other embodiments, radius 208R may be a varying value. For example, the magnitudes of radius 208R from the center point 208C to each of two different locations on the center line 208A may be different.

As illustrated, in some embodiments that may be combined with other embodiments, radius 210R may be a fixed value. For example, the magnitude of radius 210R from the center point 210C to any location on the center line 210A is a constant value. However, in alternative embodiments that may be combined with other embodiments, radius 210R may be a varying value. For example, the magnitudes of radius 210R from the center point 210C to each of two different locations on the center line 210A may be different.

As illustrated, in some embodiments that may be combined with other embodiments, radius 212R may be a fixed value. For example, the magnitude of radius 212R from the center point 212C to any location on the center line 212A is a constant value. However, in alternative embodiments that may be combined with other embodiments, radius 212R may be a varying value. For example, the magnitudes of radius 212R from the center point 212C to each of two different locations on the center line 212A may be different.

As illustrated, in some embodiments that may be combined with other embodiments, radius 214R may be a fixed value. For example, the magnitude of radius 214R from the center point 214C to any location on the center line 214A is a constant value. However, in alternative embodiments that may be combined with other embodiments, radius 214R may be a varying value. For example, the magnitudes of radius 214R from the center point 214C to each of two different locations on the center line 214A may be different.

When the magnet assembly 200 is rotated about the center of rotation 228, the arc of the center line 212A of the magnets 188A of the first open loop magnetic pole 216 of magnetic track 212 lies on a circle having a radius equal to the radius 212R. Although the magnetic track 212 is open loop, when the magnet assembly 200 is rotated about the center of rotation 228 at a sufficient speed, such as at least 20 rpm, or even at least 30 rpm, or even at least 60 rpm, the magnetic track 212 behaves like a closed loop magnetic track.

In the depicted embodiment, the radius 214R of the arc of the center line 214A is shorter than the radius 210R of the arc of the center line 210A. In the depicted embodiment, the radius 210R of the arc of the center line 210A is shorter than the radius 208R of the arc of the center line 208A. In the depicted embodiment, the radius 208R of the arc of the center line 208A is shorter than the radius 212R of the arc of the center line 212A.

In the depicted embodiment, the partial magnetic track 214 is located near to the center of rotation 228 of the magnet support member 172. The magnetic tracks 210 and 208 are positioned at intermediate locations between the center of rotation 228 and the radially distal edge 229 of the magnet support member 172. The magnetic track 210 is nearer to the center of rotation 228 than the magnetic track 208 is to the center of rotation 228. The partial magnetic track 214 is nearer to the center of rotation 228 than the magnetic track 210 is to the center of rotation 228. The magnetic track 212 is positioned at the radially distal edge 229 of the magnet support member 172. The magnetic track 212 is furthest of all magnetic tracks 208, 210, 212 and the partial magnetic track 214 from the center of rotation 228.

In some embodiments that may be combined with other embodiments, the magnetic track 212 located at the radially distal edge 229 of the magnet support member 172 is magnetically balanced. In some embodiments that may be combined with other embodiments, the magnetic track 212 located at the radially distal edge 229 of the magnet support member 172 is magnetically unbalanced.

In some embodiments that may be combined with other embodiments, the magnetic track 208 located nearer to the radially distal edge 229 of the magnet support member 172 than the magnetic track 210 is magnetically balanced. In some embodiments that may be combined with other embodiments, the magnetic track 208 located nearer to the radially distal edge 229 of the magnet support member 172 than the magnetic track 210 is magnetically unbalanced.

In some embodiments that may be combined with other embodiments, the magnetic track 210 located nearer to the center of rotation 228 of the magnet support member 172 than the magnetic track 208 is magnetically balanced. In some embodiments that may be combined with other embodiments, the magnetic track 210 located nearer to the center of rotation 228 of the magnet support member 172 than the magnetic track 208 is magnetically unbalanced.

In some embodiments that may be combined with other embodiments, any one or more of the magnetic tracks 208, 210, or 212 may be magnetically balanced. In some embodiments that may be combined with other embodiments, any one or more of the magnetic tracks 208, 210, or 212 may be magnetically unbalanced.

Referring to FIG. 1 in combination with FIG. 6, in some embodiments that may be combined with other embodiments, the center of rotation 228 of the magnet support member 172 is aligned with the central axis 186 of the PVD process chamber 100. Additionally, a center axis 114C of the target 114 is aligned with the central axis 186 of the PVD process chamber 100. Furthermore, the outer edge 114E of the target 114 is located at a radius 114R from the center axis 114C of the target 114.

In some of such embodiments, the magnets 188A of the first open loop magnetic pole 216 of magnetic track 212 are aligned with the edge 114E of the target 114. In some examples, the radius 114R is equal to the radius 212R. In other examples, a portion of each magnet 188A is aligned with the edge 114E of the target 114, but the radius 114R is less than the radius 212R. In yet other examples, a portion of each magnet 188A is aligned with the edge 114E of the target 114, but the radius 114R is greater than the radius 212R.

In some embodiments that may be combined with other embodiments, the magnets 188A of the first open loop magnetic pole 216 of magnetic track 212 are not aligned with the edge 114E of the target 114. In some of such embodiments, the radius 114R is less than the radius 212R. In others of such embodiments, the radius 114R is greater than the radius 212R. In an example, the magnets 188B of the second open loop magnetic pole 218 of magnetic track 212 may be aligned with the edge 114E of the target 114.

Figure 7:
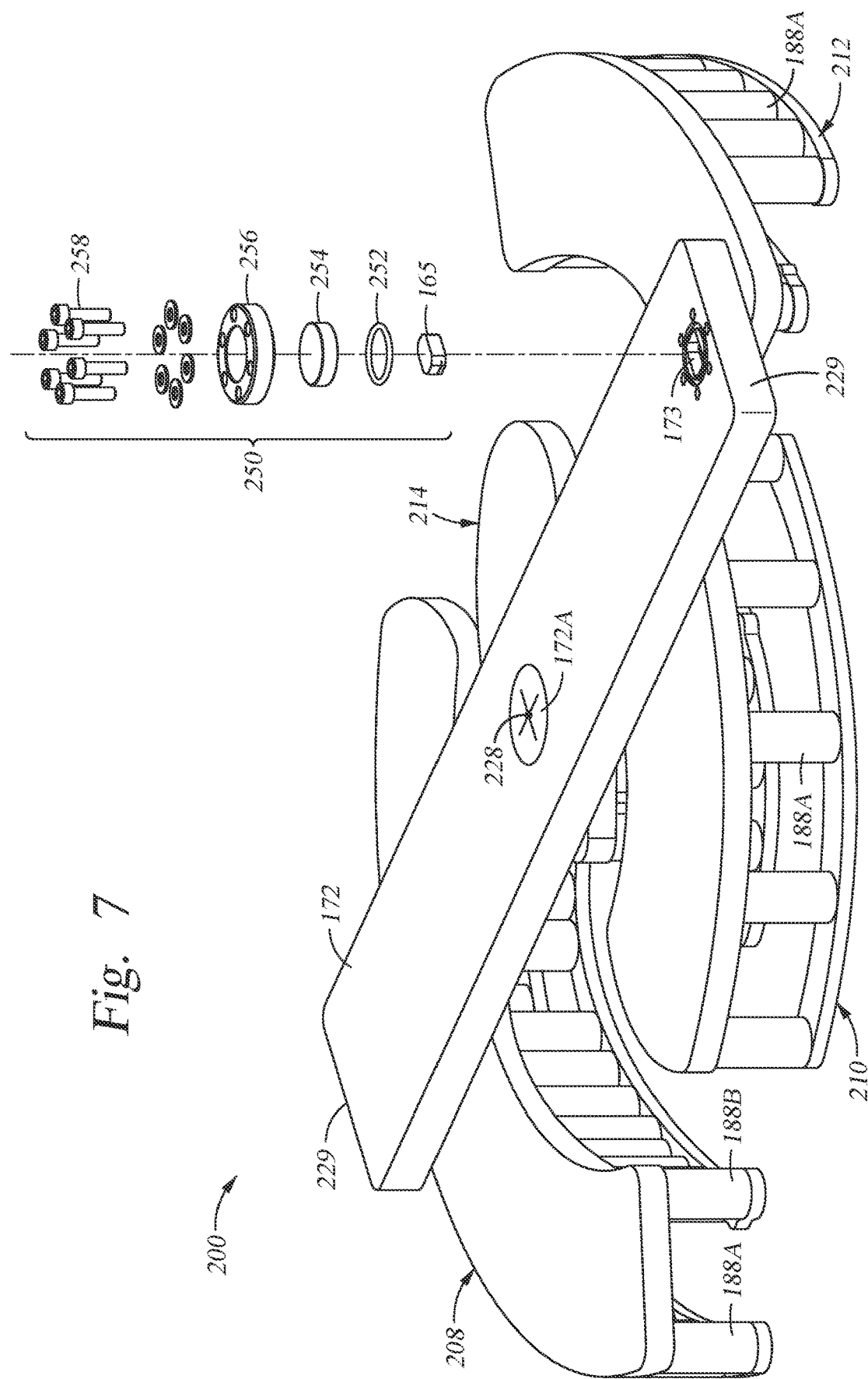
FIG. 7 schematically depicts an exploded view of an exemplary sensor target assembly for use with the magnet assembly of FIG. 2.

As shown in FIGS. 2 to 4, a sensor target assembly 250 for use with the sensor 155 (FIG. 1) is mounted to the magnet support member 172. FIG. 7 schematically depicts an exploded view of an exemplary sensor target assembly 250. In the illustrated embodiment, the sensor target 165 is disposed in an opening 173 in the magnet support member 172. A window 254 (such as quartz or sapphire) with a seal 252 (such as surrounding an outer periphery of the window 254) is disposed over the sensor target 165. The window 254 is secured by a flange 256, which is coupled to the magnet support member 172 by a plurality of fasteners, such as bolts 258.

Embodiments of the present disclosure provide systems and apparatus that realize improvements in cost, target utilization, and uniformity of films deposited on substrates compared to conventional systems and apparatus. For example, the open loop magnetic track 212 located at the radially distal edge 229 of the magnet support member 172 is shorter, lighter, and cheaper to manufacture than an equivalent ring magnet, yet upon rotation acts like a ring magnet, and promotes enhancement of the magnetic field at and around the edge 114E of the target 114. Such enhancement of the magnetic field hinders deposition of displaced target material 113 back onto the target 114. Such an effect mitigates a tendency for redeposited target material 113 to cause unwanted arcing.

Another benefit is that the positioning of each of the magnetic tracks 208, 210, 212 and the partial magnetic track 214 on the magnet support member may be adjusted to suit the type of target material 113, the size of the target 114, the spacing of the target 114 from the substrate 108, and the operating parameters. For example, aligning the magnets 188A of the first open loop magnetic pole 216 of the magnetic track 212 located at the radially distal edge 229 of the magnet support member 172, facilitates shaping the magnetic field to the curvature of the target 114, and hindering deposition of displaced target material 113 back onto the target 114.

The use of three open loop magnetic tracks 208, 210, 212 with a partial magnetic track 214 facilitates uniformity of the magnetic field across the target 114 in combination with enhancing the magnetic field at and around the edge 114E of the target 114. Such an effect promotes uniform erosion of the target material 113, uniform thickness of the target material 113 deposited onto the substrate 108, and uniform resistivity of the target material 113 deposited onto the substrate 108.

Further benefits of uniform erosion of the target material 113 include greater utilization of target material 113 than with conventional systems. Further benefits of tailoring the shaping of the magnetic field to the curvature of the target 114 include reducing deposition of target material 113 onto process kit, such as the shield 138, compared with conventional systems. Such benefits, alone or in combination, provide increased useful life of the target material 113 and the process kit, which facilitates the processing of more substrates between stoppages for maintenance of the process chambers.

Further benefits of embodiments of the present disclosure include the expansion of operating parameter ranges, which facilitates greater operational flexibility for deposition processes. In an example, the use of conventional RF PVD process chambers and systems for the deposition of tungsten was impractical at RF frequencies of 40 MHz and greater. In contrast, embodiments of the present disclosure facilitate the deposition of tungsten at RF frequencies of 40 MHz and greater. In another example, the use of conventional RF PVD process chambers and systems for the deposition of tungsten was impractical at pressures of 100 mTorr and greater. In contrast, embodiments of the present disclosure facilitate the deposition of tungsten at pressures of 100 mTorr and greater.

While the foregoing is directed to embodiments of the present disclosure, other and further embodiments of the disclosure may be devised without departing from the basic scope thereof.

What is claimed is:

1. A magnet assembly comprising:
   a support member;
   a plurality of magnetic tracks coupled to the support member, each magnetic track comprising a pair of magnetic poles including:
      a first magnetic pole comprising a first pole piece coupled to a first array of magnets; and
      a second magnetic pole comprising a second pole piece coupled to a second array of magnets; and
   a partial magnetic track coupled to the support member, and including an unpaired magnetic pole comprising a third pole piece coupled to a third array of magnets;
   wherein:
      each of the plurality of magnetic tracks is configured such that the first and second magnetic poles are coupled to a corresponding first shunt plate of each of the plurality of magnetic tracks;
      each first shunt plate is connected to the support member; and
      the unpaired magnetic pole is coupled to a second shunt plate that is connected to the support member.

2. The magnet assembly of claim 1, wherein the pair of magnetic poles of each magnetic track is configured such that:
   the first array of magnets is arranged as a first line of magnets;
   the second array of magnets is arranged as a second line of magnets; and
   the first and second lines of magnets are parallel to each other.

3. The magnet assembly of claim 1, wherein each shunt plate is coupled to the support member, or is integral with the support member.

4. The magnet assembly of claim 1, wherein:
each magnet of the first array of magnets is oriented with a south pole proximal to the first shunt plate and a north pole distal from the first shunt plate; and
each magnet of the second array of magnets is oriented with a north pole proximal to the first shunt plate and a south pole distal from the first shunt plate.

5. The magnet assembly of claim 4, wherein each magnet of the third array of magnets is oriented with a south pole proximal to the second shunt plate and a north pole distal from the second shunt plate.

6. The magnet assembly of claim 5, wherein at least a portion of the second magnetic pole of one of the plurality of magnetic tracks is adjacent to at least a portion of the unpaired magnetic pole of the partial magnetic track.

7. The magnet assembly of claim 1, wherein:
the plurality of magnetic tracks includes first and second magnetic tracks, in each of which:
the first array of magnets is in a first polar orientation; and
the second array of magnets is in a second polar orientation opposite to the first orientation;
in the partial magnetic track, the third array of magnets is in the first polar orientation; and
at least a portion of the partial magnetic track is positioned between the second array of magnets of the first magnetic track and the second array of magnets of the second magnetic track.

8. The magnet assembly of claim 1, wherein the partial magnetic track and the plurality of magnetic tracks are coupled to the support member such that the magnet assembly is rotationally balanced.

9. A magnet assembly, comprising:
a support member;
a first magnetic track coupled to the support member, and including:
a first magnetic pole comprising a first array of magnets arranged in a first line forming a first arc; and
a second magnetic pole comprising a second array of magnets arranged in a second line forming a second arc;
wherein the first and second magnetic poles are positioned side-by-side such that a separation between the first and second lines is constant along a length of the second line; and
a partial magnetic track coupled to the support member, and including an unpaired magnetic pole comprising a third array of magnets arranged in a third line forming a third arc;
wherein:
the first arc is defined by a first radius from a first center point;
the third arc is defined by a second radius from a second center point; and
the first radius is greater than the second radius.

10. The magnet assembly of claim 9, wherein the first center point is coincident with a center of rotation of the support member.

11. The magnet assembly of claim 9, further comprising:
a second magnetic track coupled to the support member, and including:
a fourth magnetic pole comprising a fourth array of magnets arranged in a fourth line forming a fourth arc; and
a fifth magnetic pole comprising a fifth array of magnets arranged in a fifth line forming a fifth arc;
wherein:
the fourth and fifth magnetic poles are positioned side-by-side such that a separation between the fourth and fifth lines is constant along a length of the fifth line;
the fourth arc is defined by a third radius from a third center point;
the first radius is greater than the third radius; and
the third radius is greater than the second radius.

12. The magnet assembly of claim 11, further comprising:
a third magnetic track coupled to the support member, and including:
a sixth magnetic pole comprising a sixth array of magnets arranged in a sixth line forming a sixth arc; and
a seventh magnetic pole comprising a seventh array of magnets arranged in a seventh line forming a seventh arc;
wherein:
the sixth and seventh magnetic poles are positioned side-by-side such that a separation between the sixth and seventh lines is constant along a length of the seventh line;
the sixth arc is defined by a fourth radius from a fourth center point;
the first radius is greater than the fourth radius; and
the fourth radius is greater than the second radius.

13. The magnet assembly of claim 12, wherein the first, second, third, and fourth center points are not coincident with each other.

14. A magnet assembly comprising:
a support member;
a plurality of magnetic tracks coupled to the support member, each magnetic track comprising a pair of magnetic poles including:
a first magnetic pole comprising a first pole piece coupled to a first array of magnets; and
a second magnetic pole comprising a second pole piece coupled to a second array of magnets; and
a partial magnetic track coupled to the support member, and including an unpaired magnetic pole comprising a third pole piece coupled to a third array of magnets;
wherein a position of the partial magnetic track is closer to a center of rotation of the support member than to a radially distal edge of the support member.

15. The magnet assembly of claim 14, wherein at least a first one of the plurality of magnetic tracks is coupled to the support member between the partial magnetic track and the radially distal edge of the support member.

16. The magnet assembly of claim 15, wherein at least a second one of the plurality of magnetic tracks is coupled to the support member at the radially distal edge of the support member.

* * * * *